(12) United States Patent
Okura et al.

(10) Patent No.: US 7,012,336 B2
(45) Date of Patent: Mar. 14, 2006

(54) SEMICONDUCTOR DEVICE WITH A FLUORINATED SILICATE GLASS FILM AS AN INTERLAYER METAL DIELECTRIC FILM, AND MANUFACTURING METHOD THEREOF

(75) Inventors: Seiji Okura, Tokyo (JP); Koji Oda, Tokyo (JP); Mahito Sawada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/446,876

(22) Filed: May 29, 2003

(65) Prior Publication Data
US 2003/0211721 A1  Nov. 13, 2003

Related U.S. Application Data

(62) Division of application No. 09/802,951, filed on Mar. 12, 2001, now Pat. No. 6,579,787.

(30) Foreign Application Priority Data
Aug. 9, 2000  (JP) .............................. 2000-241267

(51) Int. Cl.
*H01L 23/48*  (2006.01)
(52) U.S. Cl. ..................... 257/758; 257/753; 257/760
(58) Field of Classification Search ............... 257/758, 257/760, 773, 774, 750–753, 762, 765; 438/622, 438/624, 637–640
See application file for complete search history.

(56) References Cited

U.S. PATENT DOCUMENTS

| 5,436,200 | A | 7/1995 | Tanaka |
| 5,753,564 | A | 5/1998 | Fukada |
| 5,827,785 | A | 10/1998 | Bhan et al. |
| 5,872,065 | A | 2/1999 | Sivaramakrishnan |
| 5,946,601 | A | 8/1999 | Wong et al. |
| 5,953,625 | A | 9/1999 | Bang |
| 5,958,508 | A | 9/1999 | Adetutu et al. |
| 6,001,728 | A | 12/1999 | Bhan et al. |
| 6,008,120 | A | 12/1999 | Lee |
| 6,013,581 | A | 1/2000 | Wu et al. |
| 6,117,747 | A | 9/2000 | Shao et al. |
| 6,121,164 | A | 9/2000 | Yieh et al. |
| 6,153,509 | A | 11/2000 | Watanabe et al. |

(Continued)

FOREIGN PATENT DOCUMENTS

JP  2000-68267  3/2000

*Primary Examiner*—Carl Whitehead, Jr.
*Assistant Examiner*—Thanhha Pham
(74) *Attorney, Agent, or Firm*—McDermott Will & Emery LLP

(57) ABSTRACT

A plurality of metal wire layers consisting of a first metal wire layer and a second metal wire layer are formed on a semiconductor substrate. A fluorinated silicate glass film serving as an interlayer metal dielectric film is formed between the first and second metal wire layers. A silicon nitride film serving as a protective insulation film is formed on the fluorinated silicate glass film layer. An adhesive layer made of, for example, a P—SiO film, P—SiON film, or PE-SiO film, is formed between the fluorinated silicate glass film and the silicon nitride film.

7 Claims, 4 Drawing Sheets

U.S. PATENT DOCUMENTS

| | | |
|---|---|---|
| 6,153,512 A | 11/2000 | Chang et al. |
| 6,211,570 B1 * | 4/2001 | Kakamu ................. 257/760 |
| 6,218,229 B1 | 4/2001 | Youn et al. |
| 6,218,299 B1 | 4/2001 | Akahori et al. |
| 6,239,024 B1 | 5/2001 | Huang et al. |
| 6,278,174 B1 | 8/2001 | Havemann et al. |
| 6,291,331 B1 | 9/2001 | Wang et al. |
| 6,376,353 B1 | 4/2002 | Zhou et al. |

* cited by examiner

SEMICONDUCTOR DEVICE WITH A FLUORINATED SILICATE GLASS FILM AS AN INTERLAYER METAL DIELECTRIC FILM, AND MANUFACTURING METHOD THEREOF

This application is a divisional of application Ser. No. 09/802,951 filed Mar. 12, 2001, now U.S. Pat. No. 6,579,787.

BACKGROUND OF THE INVENTION

1. Field of the Invention

The present invention relates to a semiconductor device using a fluorinated silicate glass film as an interlayer metal dielectric film, and relates to a method of manufacturing a semiconductor device. More particularly, the present invention relates to an improvement in the adhesion between the fluorinated silicate glass film and a silicon nitride film serving as a protective insulation film.

2. Description of the Background Art

In a semiconductor device having a multilayer metal interconnection (a plurality of metal wire layers), a fluorinated silicate glass film (hereinafter simply called "FSG") is used as an electrical insulation layer (hereinafter called an interlayer metal dielectric film (IMD)) to be interposed between the plurality of metal wire layers.

FIGS. 5A and 5B are cross-sectional views for describing a conventional semiconductor device.

In FIG. 5A, reference numerals 21 and 22 designate metal wire layers; 3 designates FSG serving as an interlayer metal dielectric film formed between the metal wire layers 21 and 22; and 5 designates a silicon nitride film which serves as a protective insulation film (also called a "passivation film") and is to be laid on the highest layer of the semiconductor device.

In the conventional semiconductor device, the FSG serving as the interlayer metal dielectric film 3 emits free fluorine (not shown). The thus-emitted free fluorine diffuses outward, thus forming fluorine substances. The expression "fluorine substances" used herein designates fluorine itself, contamination precursor components, and fluorine-containing contamination compounds spontaneously generated from the precursor components.

The fluorine substances are accumulated along a boundary surface between the FSG 3 and the silicon nitride film (serving as the protective insulation film) 5.

The silicon nitride film 5 has a strong blocking effect against the fluorine substances, thus preventing diffusion of the fluorine substances. Accordingly, the fluorine substances are accumulated at high concentration along a boundary surface between the FSG 3 and the silicon nitride film 5.

For this reason, there is a chance of swelling or exfoliation of the silicon nitride film 5 arising.

As shown in FIG. 5B. even in the vicinity of the outer periphery of a semiconductor substrate 1, the fluorine substances are concentrated along the boundary surface of the FSG 3 and the silicon nitride film 5. Therefore, the silicon nitride film 5 is prone to be exfoliated.

As mentioned above, weak adhesion exists between the FSG 3 serving as the interlayer metal dielectric film and the silicon nitride film 5 serving as the protective insulation film. Therefore, swelling or exfoliation of the silicon nitride film 5 arises, thereby deteriorating the performance or reliability of the semiconductor device.

SUMMARY OF THE INVENTION

The present invention has been conceived to solve the previously-mentioned problems and a general object of the present invention is to provide a novel and useful semiconductor device, and to provide a novel and useful method of manufacturing a semiconductor device.

A more specific object of the present invention is to improve adhesion between an interlayer metal dielectric film and a protective insulation film.

A more specific another object of the present invention is to prevent exfoliation of a protective insulation film from the vicinity of outer periphery of a semiconductor substrate.

The above objects of the present invention are attained by a following semiconductor device, and by a following method of manufacturing a semiconductor device.

According to one aspect of the present invention, the semiconductor device comprises a semiconductor substrate; a plurality of metal wire layers formed on the semiconductor substrate; a plurality of fluorinated silicate glass films formed respectively between the plurality of metal wire layers, and the plurality of fluorinated silicate glass films acting as interlayer metal dielectric film; a silicon nitride film formed on the highest fluorinated silicate glass film, and the silicon nitride film acting as a protective insulation film; and an adhesive layer formed between the highest fluorinated silicate glass film and the silicon nitride film.

In the semiconductor device, since the adhesive layer is formed between the highest fluorinated silicate glass film and the silicon nitride film, adhesion between the fluorinated silicate glass film and the silicon nitride film can be improved. Accordingly, swelling or exfoliation of the silicon nitride film can be prevented, which in turn improves the reliability of the semiconductor device.

According to another aspect of the present invention, the semiconductor device comprises a semiconductor substrate; a plurality of metal wire layers formed on the semiconductor substrate; a plurality of fluorinated silicate glass film formed between the plurality of metal wire layers, and the plurality of fluorinated silicate glass films acting as an interlayer metal dielectric film; and a silicon nitride film which is integrally formed on the sides of the highest fluorinated silicate glass film, on the highest fluorinated silicate glass film, and on the highest metal wire layer, and on the silicon nitride film acting as a protective insulation film.

In the semiconductor device, since the silicon nitride film is formed on the sides of the fluorinated silicate glass film as well, exfoliation of the silicon nitride film can be prevented from the edge of the fluorinated silicate glass film.

According to another aspect of the present invention, in a manufacturing method of a semiconductor device, a first metal wire layer is formed on a semiconductor substrate in a first metal wire layer formation step. Next, a fluorinated silicate glass film serving as an interlayer metal dielectric film is formed on the first metal wire layer in an interlayer metal dielectric film formation step. Next, a second metal wire layer is formed on the fluorinated silicate glass film in a second metal wire layer formation step. Next, an adhesive layer is formed on the fluorinated silicate glass film and on the second metal wire layer in an adhesive layer formation step. Next, a silicon nitride film serving as a protective insulation film is formed on the adhesive layer in a protective insulation film formation step.

In the semiconductor device, since the adhesive layer is formed between the fluorinated silicate glass film and the silicon nitride film, swelling or exfoliation of the silicon nitride film can be prevented.

Other objects and further features of the present invention will be apparent from the following detailed description when read in conjunction with the accompanying drawings.

DETAILED DESCRIPTION OF THE PREFERRED EMBODIMENTS

Figure 1:
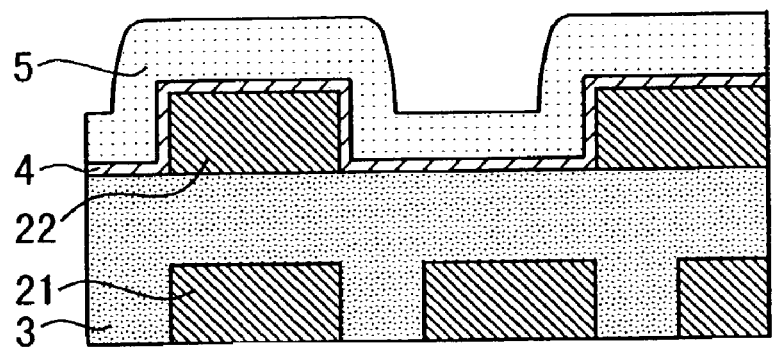
FIG. 1 is a cross-sectional view for describing a semiconductor device and a method of manufacturing a semiconductor device, according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a cross-sectional view describing a semiconductor device and a method of manufacturing a semiconductor device, according to a first embodiment of the present invention.

First, the structure of a semiconductor device will now be described.

In connection with FIG. 1, reference numeral 21 designates a first metal wire layer; 22 designates a second metal wire layer; 3 designate a fluorinated silicate glass film (hereinafter simply called "FSG") serving as an interlayer metal dielectric film; 4 designates an adhesive layer (which will be described later); and 5 designates a silicon nitride film (e.g. P—SiN film) serving as a protective insulation film (also called a "passivation film").

As shown in FIG. 1, a semiconductor device according to a first embodiment of the present invention comprises a semiconductor substrate (not shown), and a multilayer interconnection. The multilayer interconnection comprises a plurality of metal wire layers. Here, the plurality of metal wire layers consists of a first metal wire layer 21 and a second metal wire layer 22. FSG 3 is formed between the first metal wire layer 21 and the second metal wire layer 22.

An adhesive layer 4 is formed on the second metal wire layer 22 and the FSG 3. Here, the second metal wire layer 22 is the highest metal wire layer on the semiconductor substrate, and the FSG 3 is the highest FSG on the semiconductor substrate. A silicon nitride film 5 is formed on the adhesive layer 4.

More specifically, the adhesive layer 4 is formed between the highest FSG 3 and the silicon nitride film 5.

The adhesive layer 4 has the property of diffusing fluorine substances therein. Here, the fluorine substances designate fluorine itself, contamination precursor components, and fluorine-containing contamination compounds spontaneously generated from the precursor components.

The only requirement is that the adhesive layer 4 be formed on the highest FSG 3, and there is no necessity of the adhesive layer 4 being formed on the second metal wire layer 22.

Any one of the following three thin films (1) to (3) is used as the adhesive layer 4.

(1) A first specific example of the adhesive layer 4 is a P—SiO film or a P—SiON film formed by means of the diode parallel plate plasma enhanced CVD method, which will be described later. Here, the P—SiO film or the P—SiON film has a thickness of 10 to 1000 nm and typically has a thickness of 10 to 300 nm.

The P—SiO film or P—SiON film may be formed not through use of the diode parallel plate plasma enhanced CVD method, but through use of the high-density plasma (HDP) CVD method.

(2) A second specific example of the adhesive layer 4 is a PE-SiO film formed by means of the plasma acceleration CVD method, which will be described later. Here, the PE-SiO film has a thickness of 50 to 2000 nm and typically has a thickness of 100 to 300 nm.

(3) A third specific example of the adhesive layer 4 is a SiO film or a SiON film formed by means of a CVD method (for example, the low-pressure CVD technique or the atmospheric-pressure CVD technique) other than the plasma acceleration CVD method.

As described above, in the semiconductor device according to the first embodiment of the present invention, the adhesive layer 4 consisting of, for example, a P—SiO film or a P—SiON film is formed between the FSG 3 serving as the highest interlayer metal dielectric film and the silicon nitride film 5 serving as the protective insulation film.

The adhesive layer 4 causes the fluorine substances emitted from the FSG 3 to diffuse into the adhesive layer 4, thereby preventing concentration of the fluorine substances along the boundary surface between the FSG 3 and the silicon nitride film 5.

Therefore, swelling or exfoliation of the silicon nitride film 5 can be prevented, thus improving adhesion between the FSG 3 and the silicon nitride film 5. Thus, the reliability of the semiconductor device can be improved.

As a result of the PE-SiO film being used as the adhesive layer 4, there can be attained superior step coverage, in addition to the previously-described effect. Accordingly, the step coverage of the silicon nitride film 5 formed on the adhesive layer (PE-SiO film) 4 can be improved. Therefore, there can be provided a semiconductor device having high moisture resistance, thus improving the reliability of the semiconductor device to a much greater extent.

At least one of the upper surface of the FSG 3 and the upper surface of the adhesive layer 4 is subjected to interfacial treatment (which will be described later), to thereby produce an interfacially-treated layer. As a result, adhesion between the FSG 3 and the silicon nitride film 5 can be improved further.

Next, a method of manufacturing a semiconductor device will now be described.

With reference to FIG. 1, a first metal wire layer 21, for example aluminum (Al), copper (Cu), or their alloys, is formed on a semiconductor substrate (not shown).

Next, an interlayer metal dielectric film 3, for example FSG, is formed on the first metal wire layer 21.

Further, a second metal wire layer 22, for example aluminum (Al), copper (Cu), or their alloys, is formed on the FSG 3.

Next, an adhesive layer 4. for example a P—SiO film, a P—SiON film, or a PE-SiO film (which will be described later), is formed on the FSG 3 and the second metal wire layer 22.

Finally, a protective insulation film 5, for example a silicon nitride film, is formed on the adhesive layer 4 by means of the CVD method.

Next will be described a method of forming the adhesive layer 4.

The adhesive layer 4 corresponds to a P—SiON film or P—SiO film formed according to the following [Film Formation Condition 1] through use of the diode parallel plate plasma enhanced CVD method, or corresponds to a PE-SiO film formed according to the following [Film Formation Condition 2] through use of the plasma acceleration CVD method.

The adhesive layer 4 may be formed not through use of the diode parallel plate plasma enhanced CVD method, but through use of the HDP CVD method. Alternatively, the adhesive layer 4, for example a SiON film or a SiO film, may be formed through use of another CVD method (e.g., the atmospheric pressure CVD method or the low pressure CVD method).

[Film Formation Condition 1]

Gas: $SiH_4 + N_2O + (N_2)$, or $SiH_4 + O_2$ (each gas flows at a rate of hundreds of sccm or thereabouts)
Pressure: 1 to 3 Torr
RF Power: hundreds of watts [e.g., RF(13.56 MHz): 250 W, LF(350 to 450 kHz): 250 W]
Temperature (film formation temperature): 400° C. or less

[Film Formation Condition 2]

Gas: $TEOS + O_2$
Pressure: 1 to 3 Torrs
RF Power: hundreds of watts [e.g., RF(13.56 MHz): 300 W, LF(350 to 450 kHz): 300 W]
Temperature (film formation temperature): 400° C. or less As described above, in the method of manufacturing a semiconductor device according to the first embodiment, the FSG 3 is formed on the first metal wire layer 21, and the second metal wire layer 22 is formed on the FSG 3. Subsequently, the adhesive layer 4 is formed on the FSG 3 and the second metal wire layer 22, and the silicon nitride film 5 is formed on the adhesive layer 4.

According to the manufacturing method of the present embodiment, the adhesive layer 4 is formed between the FSG 3 and the silicon nitride film 5. Since, the fluorine substances emitted from the FSG 3 are diffused into the adhesive layer 4, concentration of the fluorine substances along the boundary surface between the FSG 3 and the silicon nitride film 5 can be prevented.

Therefore, adhesion between the FSG 3 and the silicon nitride film 5 is improved, and swelling or exfoliation of the silicon nitride film 5 can be prevented. Thus, the reliability of the semiconductor device can be improved.

At least before or after formation of the adhesive layer 4, individual film (i.e. the surface of the FSG 3 or the surface of the adhesive layer 4) is subjected to interfacial treatment by means of plasma processing under, for example the following [interfacial treatment condition]. As a result, adhesion between the FSG 3 and the silicon nitride film 5 can be improved further. The gas used in plasma processing is not limited to $O_2$ and may be Ar, $N_2$, $NH_3$, or a mixture thereof.

[Interfacial Treatment Conditions]

Gas: $O_2$ (950 sccm)
Pressure: 1 Torr
Temperature: 200° C.
Microwave Power: 1400 W
Time: 30 sec.

Even when interfacial treatment is performed not by means of plasma processing but by means of hydrofluoric-acid treatment (which will be described later), UV radiation treatment, or ozone treatment, there is attained an effect similar to that attained by means of plasma processing; in other words, adhesion between the FSG 3 and the silicon nitride film 5 can be improved.

Here, the hydrofluoric-acid treatment is interfacial treatment of immersing a wafer (corresponding to the semiconductor substrate) in a chemical solution stored in a chemical bath disposed at a draft, to thereby slightly etch the surface of the wafer (by a thickness of, for example, tens of angstroms to hundreds of angstroms) by means of wet etching. Dilute hydrofluoric acid is used as the chemical solution. A typical example of dilute hydrofluoric acid is a 1:100 hydrofluoric acid solution. Treatment time ranges from 1 to 60 seconds, and a typical treatment time is several seconds.

Second Embodiment

FIGS. 2A through 2D are cross-sectional views for describing a semiconductor device and a method of manufacturing a semiconductor device, according to a second embodiment of the present invention.

FIGS. 2A through 2D are cross-sectional views for describing a semiconductor device having the highest metal wire layer formed by means of the Damascene method, and for describing a method of manufacturing a semiconductor device including a step of forming the highest metal wire layer by means of the Damascene method.

In the second embodiment, those elements which are the same as those described in connection with the first embodiment are assigned the same or corresponding reference numerals, and repetition of their explanations is simplified or omitted. Further, repeated explanation of the method of forming an adhesive layer and the interfacial treatment method is omitted.

Figure 2A:
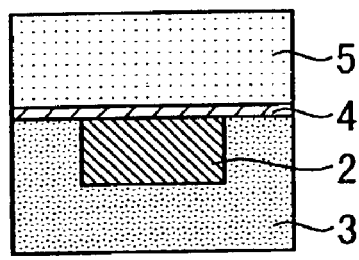
FIGS. 2A through 2D are cross-sectional views for describing a semiconductor device and a method of manufacturing the semiconductor device, according to a second embodiment of the present invention.

In connection with FIG. 2A, reference numeral 2 designates the highest metal wire layer of a plurality of metal wire layers, which are formed on a semiconductor substrate (not shown); 3 designates a FSG (fluorinated silicate glass film) serving as the highest interlayer metal dielectric film; 4 designates an adhesive layer; and 5 designates a silicon nitride film serving as a protective insulation film.

As shown in FIG. 2A, the adhesive layer 4 is formed between the highest FSG 3 and the silicon nitride film 5 formed on the FSG 3. In the drawing, the adhesive layer 4 is formed on the FSG 3 and the metal wire layer 2. Here, there is a minimum requirement that the adhesive layer 4 be formed on at least the FSG 3.

Figure 2B:
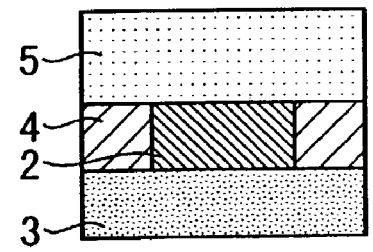

In connection with FIG. 2B, reference numeral 2 designates a metal wire layer; 3 designates a FSG; 4 designates an adhesive layer; and 5 designates a silicon nitride film.

As shown in FIG. 2B, the adhesive layer 4 is formed between the FSG 3 and the silicon nitride film 5 formed on the FSG 3.

Figure 2C:
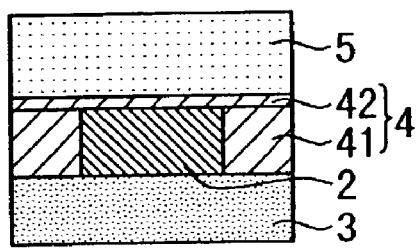

In connection with FIG. 2C, reference numeral 2 designates a metal wire layer; 3 designates a FSG; 41 designates a first adhesive layer; 42 designates a second adhesive layer; and 5 designates a silicon nitride film.

As shown in FIG. 2C, the two adhesive layers 41 and 42 are formed between the FSG 3 and the silicon nitride film 5 formed on the FSG 3.

Figure 2D:
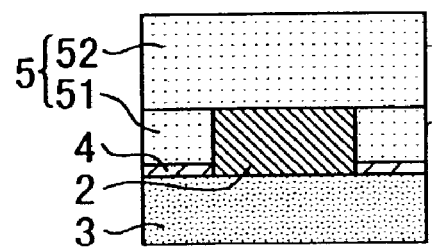

In connection with FIG. 2D. reference numeral 2 designates a metal wire layer; 3 designates an FSG; 4 designates an adhesive layer; 51 designates a first silicon nitride film; and 52 designates a second silicon nitride film.

As shown in FIG. 2D, the adhesive layer 4 is formed between the FSG 3 and the silicon nitride film 5 consisting of the first and second silicon nitride films 51 and 52.

As described above, in the semiconductor device according to the second embodiment, the adhesive layer 4 is formed between the FSG 3 serving as the highest interlayer metal dielectric film and the silicon nitride film 5 serving as the protective insulation film.

As described in connection with the first embodiment, the adhesive layer 4 causes the fluoride substances emitted from the FSG 3 to diffuse into the adhesive layer 4. Therefore, concentration of the fluoride substances along the boundary surface between the FSG 3 and the silicon nitride film 5 can be prevented.

Accordingly, adhesion between the FSG 3 and the silicon nitride film 5 can be improved, and swelling or exfoliation of the silicon nitride film 5 can be prevented. Therefore, the reliability of the semiconductor device can be improved.

At least one of the FSG 3 or the adhesive layer 4 is subjected to interfacial treatment (see the first embodiment), wherewith an interfacially-treated surface is produced. As a result, adhesion between the highest FSG 3 and the silicon nitride film 5 can be improved further. Consequently, the reliability of the semiconductor device can be improved.

Next will be described a method of manufacturing a semiconductor device.

First, a first method of manufacturing a semiconductor device will now be described by reference to FIG. 2A.

With reference to FIG. 2A, a FSG 3 serving as the highest interlayer metal dielectric film is formed on a semiconductor substrate (not shown). Next, the metal wire layer 2 is formed in the FSG 3 by means of the Damascene method.

Next, the adhesive layer 4 is formed on the FSG 3 and the metal wire layer 2.

Finally, the silicon nitride film 5 serving as a protective insulation film is formed on the adhesive layer 4.

The only requirement is that the adhesive layer 4 be formed on at least the FSG 3, and the adhesive layer 4 is not necessarily formed on the metal wire layer 2.

Next, a second method of manufacturing a semiconductor device will now be described by reference to FIG. 2B.

With reference to FIG. 2B, a FSG 3 serving as the highest interlayer metal dielectric film is formed on a semiconductor substrate (not shown). Next, an adhesive layer 4 is formed on the FSG 3.

Next, a metal wire layer 2 is formed in the adhesive layer 4 by means of the Damascene method.

Finally, a silicon nitride film 5 serving as a protective insulation film is formed on the metal wire layer 2 and the adhesive layer 4.

Next, a third method of manufacturing a semiconductor device will now be described by reference to FIG. 2C.

With reference to FIG. 2C, a FSG 3 serving as the highest interlayer metal dielectric film is formed on a semiconductor substrate (not shown). Next, a first adhesive layer 41 is formed on the FSG 3.

Next, a highest metal wire layer 2 is formed in the first adhesive layer 41. Further, a second adhesive layer 42 is formed on the metal wire layer 2 and the first adhesive layer 41.

Finally, a silicon nitride film 5 serving as a protective insulation film is formed on the second adhesive layer 42.

Next, a fourth method of manufacturing a semiconductor device will now be described by reference to FIG. 2D.

With reference to FIG. 2D, a FSG 3 serving as the highest interlayer metal dielectric film is formed on a semiconductor substrate (not shown). Next, a first adhesive layer 4 is formed on the FSG 3.

Next, a first silicon nitride film 51 serving as a first protective insulation film is formed on the first adhesive layer 41. Further, a highest metal wire layer 2 is formed in the first silicon nitride film 51 and the adhesive layer 4 by means of the Damascene method.

Finally, a second silicon nitride film 52 serving as a second protective insulation film is formed on the first silicon nitride film 51 and the metal wire layer 2.

As described above, in the methods of manufacturing a semiconductor device according to the second embodiment, the highest metal wire layer 2 is formed by means of the Damascene method, and the adhesive layer 4 is formed between the highest FSG 3 and the silicon nitride film 5.

As a result, the fluorine substances emitted from the FSG 3 diffuse into the adhesive layer 4. Thus, concentration of the fluorine substances along the boundary surface between the FSG 3 and the silicon nitride film 5 can be prevented.

Accordingly, adhesion between the FSG 3 and the silicon nitride film 5 can be improved, and swelling or exfoliation of the silicon nitride film 5 can be prevented. Thus,the reliability of the semiconductor device can be improved.

At least before and after formation of the adhesive layer 4, individual film (i.e. the surface of the FSG 3 or the surface of the adhesive layer 4) is subjected to interfacial treatment (see the first embodiment), thereby further improving adhesion between the FSG 3 and the silicon nitride film 5. Accordingly, the reliability of the semiconductor device can-be improved further.

Third Embodiment

Figure 3A:
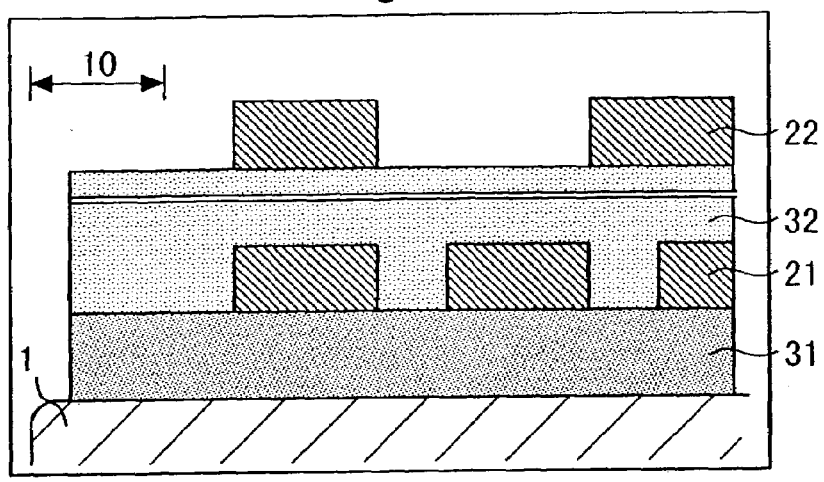
FIGS. 3A through 3C are cross-sectional views for describing a semiconductor device and a method of manufacturing a semiconductor device, according to a third embodiment of the present invention.
Figure 3B:
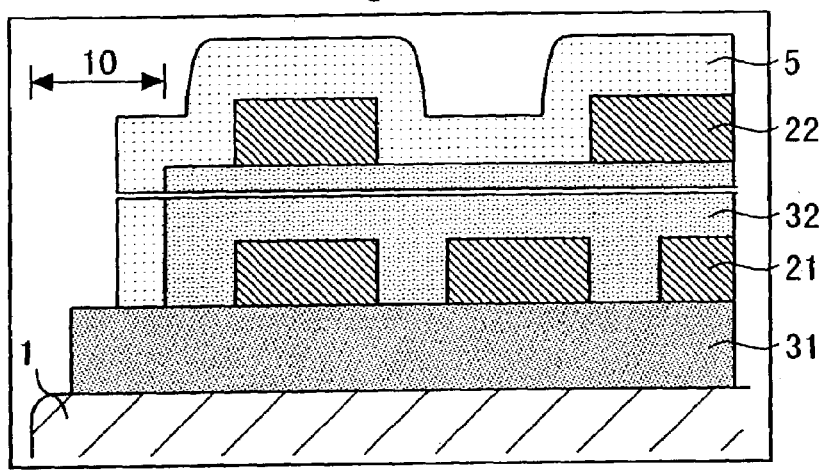
Figure 3C:
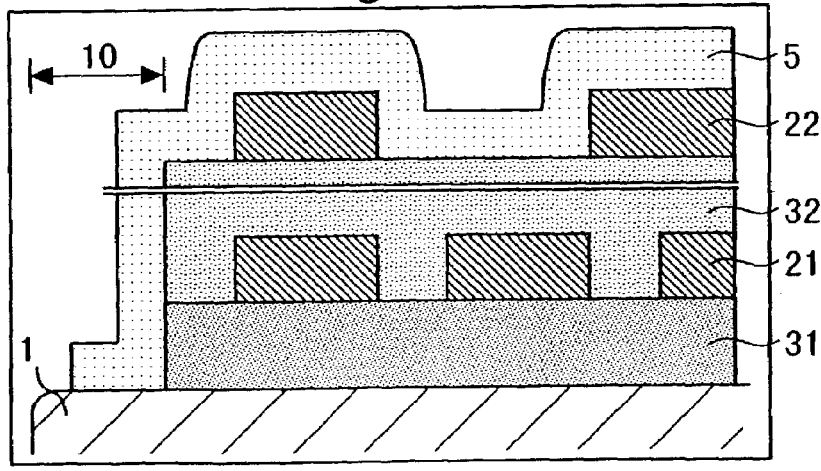

FIGS. 3A through 3C are cross-sectional views for describing a semiconductor device and a method of manufacturing a semiconductor device, according to a third embodiment of the present invention.

A semiconductor device is described by reference to FIGS. 3B and 3C. and a method of manufacturing a semiconductor device is described by reference to FIGS. 3A through 3C.

In the third embodiment, those elements which are identical with or correspond to those described in connection with the first embodiment are assigned the same reference numerals. Repetition of their explanations will be simplified or omitted. Further, explanation of a method of forming an adhesive layer and explanation of an interfacial treatment method are omitted.

First, a semiconductor device will be described.

In connection with FIG. 3B, reference numeral 1 designates a semiconductor substrate; 21 designates a first metal wire layer; 22 designates a second metal wire layer; 31 designates a first FSG serving as a first interlayer metal dielectric film; 32 designates a second FSG serving as a second interlayer metal dielectric film; and 5 designates a silicon nitride film serving as a protective insulation film.

As shown in FIG. 3B, a plurality of metal wire layers consisting of the first metal wire layer 21 and the second metal wire layer 22 are formed on the semiconductor substrate 1. The first FSG 31 is formed between the first metal wire layer 21 and the semiconductor substrate 1, and the second FSG 32 is formed between the first metal wire layer 21 and the second metal wire layer 22.

The silicon nitride film 5 is integrally formed on the upper surface of the highest (second) FSG 32, the highest (second) metal wire layer 22, and the side surfaces of the FSG 32.

A semiconductor device shown in FIG. 3C is analogous in structure to that shown in FIG. 3B. The semiconductor devices differ from each other in that in the semiconductor device shown in FIG. 3C the silicon nitride film 5 is further formed on the side surfaces of the first FSG 31 and on areas of the semiconductor substrate 1 around the FSG 31.

More particularly, as shown in FIG. 3C, the silicon nitride film 5 is integrally formed on the upper surface of the highest (second) FSG 32, the second metal wire layer 22, the side surfaces of the FSG 32 and 31, and on areas of the semiconductor substrate 1 around the FSG 31. Here, adhesion between the silicon nitride film 5 and the semiconductor substrate is stronger than adhesion between the silicon nitride film 5 and the FSG 32.

As described above, in the semiconductor device according to a third embodiment, the silicon nitride film 5 serving as a protective dielectric film is formed so as to integrally cover the highest (second) FSG 32, the second metal wire layer 22, and the side surfaces of the FSG 32.

Accordingly, exfoliation of the silicon nitride film 5 from the vicinity of the outer periphery of the semiconductor substrate 1 can be prevented. Thus, the reliability of the semiconductor device can be improved.

The silicon nitride film 5 is further formed on the side surfaces of the first FSG 31 and on areas of the semiconductor substrate 1 around the FSG 31 and 32. As a result, exfoliation of the silicon nitride film 5 around the outer periphery of the semiconductor substrate 1 can be prevented further effectively. Accordingly, the reliability of the semiconductor device can be improved further.

When an adhesive layer (see the first adhesive layer 4 described in connection with the first embodiment) may be formed between the highest FSG 32 and the silicon nitride film 5. Thus, fluorine substances emitted from the highest FSG 32 diffuse into the adhesive layer. Accordingly, concentration of the fluorine substances along the boundary surface between the highest FSG 32 and the silicon nitride film 5 can be diminished, thus preventing swelling or exfoliation of the silicon nitride film 5. Thus, the reliability of a semiconductor device can be improved further.

At least one of the upper surface of the FSG 32 and the upper surface of an adhesive layer is subjected to interfacial treatment (see the first embodiment), thereby producing an interfacially-treated surface. Therefore, adhesion between the highest FSG 32 and the silicon nitride film 5 can be improved further.

Next, a method of manufacturing a semiconductor device will be described.

As shown in FIG. 3A, a first FSG 31 serving as a first interlayer metal dielectric film is formed on a semiconductor substrate 1. Next, a first metal wire layer 21 is formed on the first FSG 31.

Next, a second FSG 32 serving as a second interlayer metal dielectric film is formed on the FSG 31 and the first metal wire layer 21. Further, a second metal wire layer 22 is formed on the second FSG 32.

Next, as shown in FIG. 3B, the thus-formed second FSG 32 is eliminated within a range 10 from the outer periphery of the semiconductor substrate 1. More specifically, the side surfaces of the second FSG 32 located in the vicinity of the outer periphery of the semiconductor substrate 1 are eliminated.

Finally, a silicon nitride film 5 serving as a protective insulation film is formed so as to integrally cover the side surfaces of the second FSG 32, the second FSG 32, and the second metal wire layer 22.

After removal of the second FSG 32 within a range 10 from the outer periphery of the semiconductor substrate 1 as mentioned above, the first FSG 31 formed within a predetermined range 10 may be further removed, as shown in FIG. 3C.

Subsequently, the silicon nitride film 5 serving as a protective insulation film is formed so as to integrally cover the portions of the semiconductor substrate 1 exposed as a result of removal of the first FSG 31, the side surfaces of the FSG 31 and 32, the second FSG 32, and the second metal wire layer 22.

As described above, in the method of manufacturing a semiconductor device according to the third embodiment, the side surfaces of the second FSG 32 are removed. The silicon nitride film 5 serving as a protective insulation film is formed so as to integrally cover the top and side surfaces of the second FSG 32, which surfaces are exposed as a result of removal of the second FSG 32, and the second metal wire layer 22.

Accordingly, exfoliation of the silicon nitride film 5 from the vicinity of the outer periphery of the semiconductor substrate 1 can be prevented, thus improving the reliability of the semiconductor device.

The side surfaces of the first FSG 31 and the second FSG 32 are removed, to thereby cause the surface of the semiconductor substrate 1 to become exposed. The silicon nitride film 5 serving as a protective insulation film is formed so as to integrally cover the portions of the semiconductor substrate 1 exposed as a result of removal of the first and second FSG 31 and 32; the side surfaces of the FSG 31 and 32, the second FSG 32; and the second metal wire layer 22. Therefore, adhesion of the silicon nitride film 5 in the vicinity of the outer periphery of the semiconductor substrate 1 can be improved further.

Accordingly, prevention of exfoliation of the silicon nitride film 5 from the vicinity of the outer periphery of the semiconductor substrate 1 can be improved further, thus improving the reliability of the semiconductor device.

Alternatively, an adhesive layer may be formed on the second FSG 32, and the silicon nitride film 5 may be formed on the thus-formed adhesive layer. In this case, the adhesive layer causes the fluorine substances emitted from the second FSG 32 to diffuse into the adhesive layer. Thus, concentration of the fluorine substances along the boundary surface between the second FSG 32 and the silicon nitride film 5 can be prevented. Therefore, adhesion between the second FSG 32 and the silicon nitride film 5 can be improved further, thereby improving the reliability of the semiconductor device.

At least before or after formation of the adhesive layer 4, individual film is subjected to interfacial treatment (see the first embodiment). As a result, adhesion between the highest FSG 32 and the silicon nitride film 5 can be improved further.

Fourth Embodiment

Figures 4A, 4B:
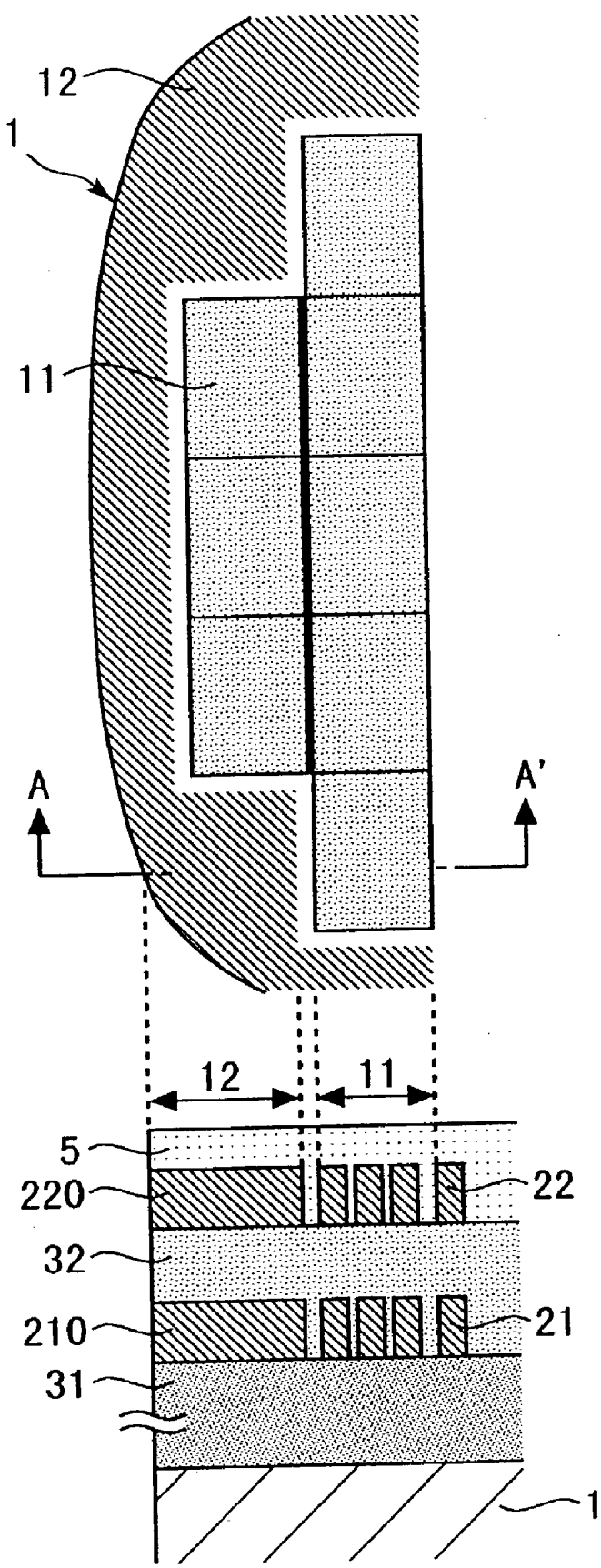
FIG. 4A is a plan view describing a semiconductor device, according to a forth embodiment of the present invention.
FIG. 4B is a cross-sectional view describing a semiconductor device taken along line AA' shown in FIG. 4A, according to a forth embodiment of the present invention.
Figure 5A:
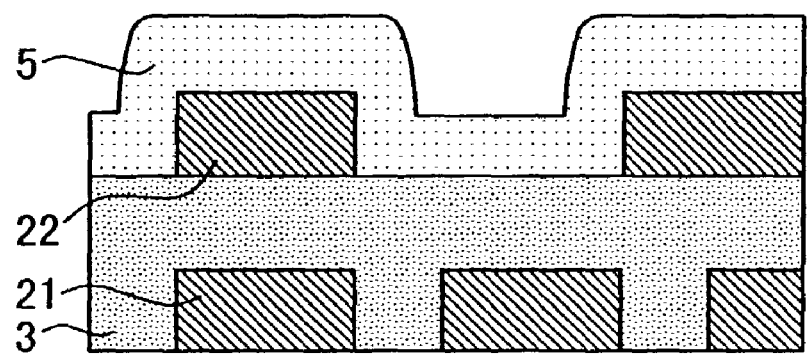
FIGS. 5A and 5B are cross-sectional views for describing a conventional semiconductor device.
Figure 5B:
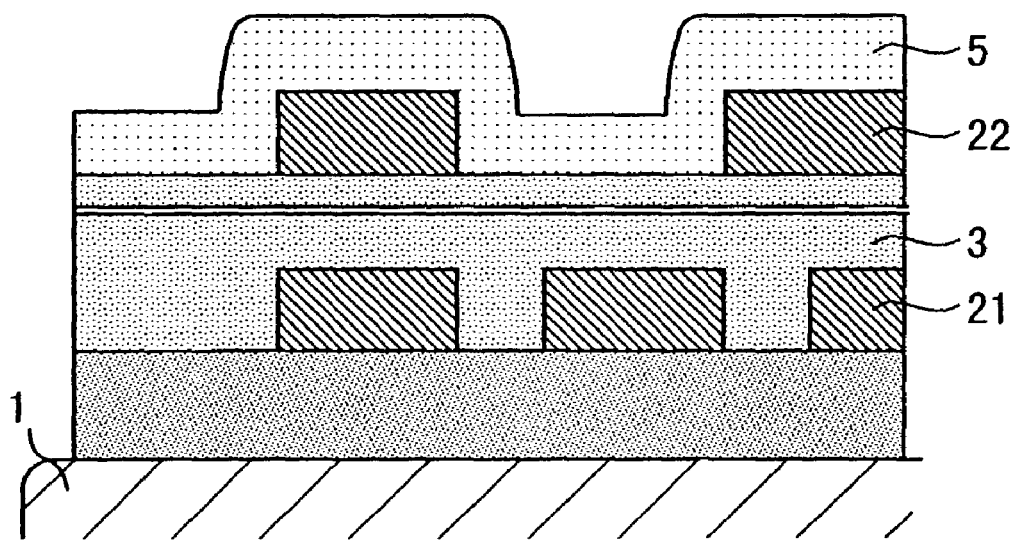

FIGS. 4A and 4B are views for describing a semiconductor device and a method of manufacturing a semiconductor device according to a fourth embodiment of the present invention. More specifically, FIG. 4A is a plan view describing for a semiconductor device, and FIG. 4B is a cross-sectional view for describing the semiconductor device taken along line AA' shown in FIG. 4A.

In the fourth embodiment, those elements which are identical with or correspond to those of the semiconductor device described in connection with the first embodiment are assigned the same reference numerals, and repetition of their explanation is simplified or omitted. Further, explanation of a method of forming an adhesive layer and explanation of an interfacial treatment method are omitted.

First, the structure of a semiconductor device will be described.

In connection with FIG. 4A, reference numeral 1 designates a semiconductor substrate; 11 designates a chip region of the semiconductor substrate 1; and 12 designates a non-chip region. Here, the non-chip region 12 is an area in the vicinity of the outer periphery of the semiconductor substrate 1, where semiconductor devices (chips) cannot be formed by means of dicing.

In connection with FIG. 4B, reference numeral 1 designates a semiconductor substrate; 21 designates a first metal wire layer; 22 designates a second metal wire layer; 210 designates a first metal film; 220 designates a second metal film; 31 designates a first FSG serving as a first interlayer metal dielectric film; 32 designates a second FSG serving as a second interlayer metal dielectric film; and 5 designates a silicon nitride film serving as a protective insulation film.

As shown in FIG. 4B, a plurality of metal wire layers consisting of the first metal wire layer 21 and the second metal wire layer 22 are formed within a chip region 11 on the semiconductor substrate 1.

The first metal film 210 is formed on the entire non-chip region 12 in the vicinity of the outer periphery of the semiconductor substrate 1, and the thus-formed first metal film 210 is flush with the first metal wire layer 21. Similarly, the second metal film 220 is formed on the entire non-chip region 12, and the thus-formed second metal film 220 is flush with the second metal wire layer 22.

The first FSG 31 is formed between the semiconductor substrate 1 and the first metal wire layer 21, and the second FSG 32 is formed between the first metal wire layer 21 and the second metal wire layer 22. Here, the second metal film 220 is superior to the second FSG 32 in terms of adhesion to the silicon nitride film 5.

The silicon nitride film 5 is formed on the highest metal film 220, the highest metal wire layer 22, and the highest FSG 32 layer.

As described above, in the semiconductor device according to the fourth embodiment, the metal film 220, which is flush with the highest metal wire layer 22, is formed on the entire non-chip region 12.

In the non-chip region 12 of the semiconductor substrate 1, adhesion between the silicon nitride film 5 and the second metal film 220 can be improved, thereby preventing exfoliation of the silicon nitride film 5 from the vicinity of the outer periphery of the semiconductor substrate 1 and improving the reliability of the semiconductor device.

An adhesive layer (see the first adhesive layer 4 of the present embodiment) may be formed between the highest (second) FSG 32 and the silicon nitride film 5. Thus, the fluorine substances emitted from the second FSG 32 are diffused into the adhesive layer. Therefore, concentration of the fluorine substances along the boundary surface between the second FSG 32 and the silicon nitride film 5 can be prevented. Consequently, swelling or exfoliation of the silicon nitride film 5 can be prevented, thereby improving the reliability of the semiconductor device.

At least one of the upper surface of the FSG 32 and the, upper surface of the adhesive layer are subjected to interfacial treatment, thereby producing an interfacially-treated surface (see the first embodiment). Therefore, adhesion between the highest FSG 32 and the silicon nitride film 5 can be improved further.

Next, a method of manufacturing the semiconductor device will now be described.

As shown in FIGS. 4A and 4B, a first FSG 31 is formed on a semiconductor substrate 1. Next, a first metal wire layer 21 is formed in a chip region 11 on the first FSG 31, and the first metal film 210 is formed on a entire non-chip region 12. Here, the first metal wire layer 21 is flush with the first metal film 210.

Next, a second FSG 32 is formed on the first metal wire layer 21. Further, a second metal wire layer 22 is formed in the chip region 11 on the second FSG 32, and a second metal film 220 is formed on the entire surface of the non-chip region 12. Here, the second metal wire layer 22 is flush with the second metal film 220.

Finally, a silicon nitride film 5 is formed on the second FSG 32, the second metal film 220, and the second metal wire layer 22.

As described above, in the method of manufacturing a semiconductor device according to the fourth embodiment, after formation of the second FSG 32, the second metal wire layer 22 serving as the highest metal wire layer is formed on the chip region 11 of the second FSG 32. The second metal film 220 is formed on the entire surface of the non-chip region 12. The silicon nitride film 5 is formed on the second FSG 32, the second metal film 220, and the second metal wire layer 22.

Adhesion between the metal film 220 formed on the entire non-chip region 12 of the semiconductor substrate 1 and the silicon nitride film 5 is stronger than adhesion existing between the FSG 32 and the silicon nitride film 5. Accordingly, exfoliation of the silicon nitride film 5 from the vicinity of the outer periphery of the semiconductor substrate 1 can be prevented, thus improving the reliability of the semiconductor device.

After formation of the second metal wire layer 22, an adhesive layer may be formed on the second FSG 32. The silicon nitride film 5 may be formed on the adhesive layer. In this case, the adhesive layer causes the fluorine substances emitted from the second FSG 32 to diffuse into the adhesive layer, thereby preventing concentration of the fluorine substances along the boundary surface between the second FSG 32 and the silicon nitride film 5. Consequently, adhesion between the second FSG 32 and the silicon nitride film 5 can be improved, which in turn improves the reliability of the semiconductor device.

Further, at least before or after formation of the adhesive layer, individual films may be subjected to interfacial treatment (see the first embodiment). As a result, adhesion between the highest FSG 32 and the silicon nitride film 5 can be improved further.

In the fourth embodiment, a multilayer film consisting of the metal films 210 and 220 is formed. However, the only requirement is that only the metal film 220 be formed so as to become flush with the highest metal wire layer 22. Namely, formation of the metal film 210 flush with the lower metal wire layer 21 may be omitted.

This invention, when practiced illustratively in the manner described above, provides the following major effects: According to a first aspect of the present invention, an adhesive layer formed between a fluorinated silicate glass film and a silicon nitride film enhances adhesion between the fluorinated silicate glass film and the silicon nitride film.

Accordingly, swelling or exfoliation of the silicon nitride film can be prevented, which in turn improves the reliability of a semiconductor device.

According to a second aspect of the present invention, a silicon nitride film is formed on the sides of a fluorinated silicate glass film as well. Consequently, exfoliation of a silicon nitride film from the edge of the fluorinated silicate glass film can be prevented.

In a preferred variation of the present invention, exfoliation of the silicon nitride film from the vicinity of outer periphery of a semiconductor substrate can be prevented.

In a preferred variation of the present invention, strong adhesion exists between a silicon nitride film and a metal film in the vicinity of the outer periphery of the semiconductor substrate, thereby preventing exfoliation of the silicon nitride film.

In a preferred variation of the present invention, the semiconductor device is further provided with an additional adhesive layer, which further improves adhesion between the fluorinated silicate glass film and the silicon nitride film.

In a preferred variation of the present invention, since individual contact surfaces are subjected to interfacial treatment, adhesion between the fluorinated silicate glass film and the silicon nitride film can be improved further.

In a preferred variation of the present invention, a P—SiO film or P—SiON film serving as an adhesion layer can be formed between a fluorinated silicate glass film and a silicon nitride film improves adhesion between the fluorinated silicate glass film and the silicon nitride film.

In a preferred variation of the present invention, since step coverage of a silicon nitride film is improved by means of taking a PE-SiO film as an adhesive layer, adhesion between the fluorinated silicate glass film and the silicon nitride film can be improved further.

According to a third aspect of the present invention, since an adhesive layer is formed between a fluorinated silicate glass film and a silicon nitride film, swelling or exfoliation of the silicon nitride film can be prevented.

In a preferred variation of the present invention, in a case where the highest metal wire layer is formed by means of the Damascene method, an adhesive layer is formed between a fluorinated silicate glass film and a silicon nitride film, thereby preventing swelling or exfoliation of a silicon nitride film.

In a preferred variation of the present invention, in a case where the highest metal wire layer is formed by means of the Damascene method, exfoliation or swelling of a silicon nitride film can be prevented even when two adhesive layers are formed between a fluorinated silicate glass film and the silicon nitride film.

In a preferred variation of the present invention, in a case where the highest metal wire layer is formed by means of the Damascene method, exfoliation or swelling of a silicon nitride film can be prevented even when two silicon nitride films are formed on the adhesive layer.

In a preferred variation of the present invention, a silicon nitride film is formed on the side surfaces of a second fluorinated silicate glass film as well as on the second fluorinated silicate glass film and the second metal wire layer. As a result, exfoliation of the silicon nitride film from the edge of the second fluorinated silicate glass film can be prevented.

In a preferred variation of the present invention, a silicon nitride film is formed on areas around a fluorinated silicate glass film, side surfaces of the fluorinated silicate glass film, a second fluorinated silicate glass film, and a second metal wire layer, thereby preventing exfoliation of a silicon nitride film from the vicinity of the outer periphery of a semiconductor substrate.

In a preferred variation of the present invention, formation of an additional adhesive layer enhances adhesion between the second fluorinated silicate glass film and the silicon nitride film.

In a preferred variation of the present invention, since strong adhesion exists between a metal film formed within a non-chip region and a silicon nitride film, exfoliation of a silicon nitride film from the vicinity of outer periphery of a semiconductor substrate can be prevented.

In a preferred variation of the present invention, interfacial treatment of contact surfaces results in an improvement in adhesion.

In a preferred variation of the present invention, the plasma CVD technique can be employed as a method of forming a P—SiO film or P—SiON film as an adhesive layer.

In a preferred variation of the present invention, the plasma acceleration CVD technique can be employed as a method of forming a PE-SiO film as an adhesive layer.

Further, the present invention is not limited to these embodiments, but variations and modifications may be made without departing from the scope of the present invention.

The entire disclosure of Japanese Patent Application No. 2000-241267 filed on Aug. 9, 2000 containing specification, claims, drawings and summary are incorporated herein by reference in its entirety.

What is claimed is:

1. A semiconductor device comprising:
   a semiconductor substrate;
   a plurality of metal wire layers formed on said semiconductor substrate, comprising a highest metal wire layer and a plurality of lower metal wire layers underlying said highest metal wire layer;
   a plurality of fluorinated silicate glass films formed respectively between said plurality of lower metal wire layers, and said plurality of fluorinated silicate glass films acting as an interlayer metal dielectric film;
   a silicon nitride film formed on the highest fluorinated silicate glass film of said plurality of fluorinated silicate glass films, and said silicon nitride film acting as a protective insulation film; and
   an adhesive layer formed overlying and in contact with said highest metal wire layer, and between said highest fluorinated silicate glass film and said silicon nitride film.

2. The semiconductor device according to claim 1, wherein
   at least one of the upper surface of said highest fluorinated silicate glass film and the upper surface of said adhesive layer is an interfacially-treated surface formed by interfacial treatment.

3. The semiconductor device according to claim 1, wherein said adhesive layer is a P—SiO film or P—SiON film.

4. The semiconductor device according to claim 3, wherein said adhesive layer has a thickness of 10 to 1000 nm.

5. The semiconductor device according to claim 1, wherein said adhesive layer is a PE-SiO film.

6. The semiconductor device according to claim 5, wherein said adhesive layer has a thickness of 50 to 2000 nm.

7. The semiconductor device according to claim 1, wherein the highest metal wire layer is formed on the highest fluorinated silicate glass film, and
   said adhesive layer is formed on said highest fluorinated silicate glass film.

* * * * *